US 7,260,373 B2

(12) United States Patent
Akamine et al.

(10) Patent No.: US 7,260,373 B2
(45) Date of Patent: Aug. 21, 2007

(54) DIRECT CONVERSION RECEIVER

(75) Inventors: Yukinori Akamine, Kokubunji (JP); Satoshi Tanaka, Kokubunji (JP); Akio Yamamoto, Hiratsuka (JP); Kazuaki Hori, Yokohama (JP)

(73) Assignee: Renesas Technology Corp., Tokyo (JP)

( * ) Notice: Subject to any disclaimer, the term of this patent is extended or adjusted under 35 U.S.C. 154(b) by 297 days.

(21) Appl. No.: 10/727,612

(22) Filed: Dec. 5, 2003

(65) Prior Publication Data

US 2004/0121746 A1 Jun. 24, 2004

(30) Foreign Application Priority Data

Dec. 20, 2002 (JP) .............................. 2002-369773

(51) Int. Cl.
*H04B 1/10* (2006.01)
(52) U.S. Cl. .................... 455/234.1; 455/312; 455/324
(58) Field of Classification Search .. 455/232.1–234.2, 455/241.1, 246.1, 296, 303, 307, 312, 324; 375/345, 346
See application file for complete search history.

(56) References Cited

U.S. PATENT DOCUMENTS

| | | | | |
|---|---|---|---|---|
| 5,918,167 | A * | 6/1999 | Tiller et al. .................. 455/310 |
| 6,442,380 | B1 * | 8/2002 | Mohindra ................. 455/234.1 |
| 6,459,889 | B1 * | 10/2002 | Ruelke ......................... 455/296 |
| 6,516,185 | B1 * | 2/2003 | MacNally ................. 455/234.1 |
| 6,516,187 | B1 * | 2/2003 | Williams et al. ............. 455/313 |
| 6,781,424 | B2 * | 8/2004 | Lee et al. ..................... 327/113 |
| 7,136,431 | B2 * | 11/2006 | Shi et al. ..................... 375/319 |
| 2002/0086651 | A1 * | 7/2002 | Prentice et al. ........... 455/234.1 |
| 2003/0098734 | A1 * | 5/2003 | Herdey et al. ............... 327/307 |
| 2003/0139147 | A1 * | 7/2003 | Shi .............................. 455/82 |
| 2003/0174079 | A1 * | 9/2003 | Soltanian et al. ........... 341/118 |

FOREIGN PATENT DOCUMENTS

| | | |
|---|---|---|
| EP | 1 102 413 A2 | 11/2000 |
| JP | 2001-211098 | 11/2000 |

OTHER PUBLICATIONS

Harald Pretl, Werner Schelmbauer, Robet Weigel, Richard Hagelauer, Bernd Adler and Josef Fenk, "Circuit and system Considerations for UMTS Xero-IF Receivers in SiGe BiCMOS", Microwave Workshop Digest (2001), pp. 264-268.

* cited by examiner

*Primary Examiner*—Nguyen T. Vo
(74) *Attorney, Agent, or Firm*—Reed Smith LLP; Stanley P. Fisher, Esq.; Juan Carlos A. Marquez, Esq.

(57) ABSTRACT

In a direct conversion receiver, to cancel a DC offset generated in the baseband processing block, negative feedback arrangements comprising a gain control amplifier and a low-pass filter are respectively attached to the I and Q signal branches of the baseband block following mixer outputs. The gain control amplifier in each negative feedback circuit is gain adjusted so that the product G·B of the gain G of a primary gain control amplifier and its own gain B will be constant and thereby the DC offset is cancelled. This DC offset cancellation can be applied in a continuous receiving system with no intermittent time during a receiving operation. Capacitance elements located off-chip can be reduced to those to be used only in the low-pass filters in the negative feedback circuits, whereas many off-chip capacitance elements have been required to be inserted between each stage of gain control amplifiers in conventional baseband chains.

11 Claims, 6 Drawing Sheets

DIRECT CONVERSION RECEIVER

BACKGROUND OF THE INVENTION

1. Field of the Invention

The present invention relates to direct conversion receivers and, more particularly, to a direct conversion receiver configured to attenuate a DC offset in a signal band which occurs in a baseband signal-processing block.

2. Description of Prior Art

As a method for canceling a DC offset in a direct conversion receiver, a method by means of high-pass filters employing capacitance elements 401 is known. Circuitry configured in accordance with this method is shown in FIG. 4. In this circuitry, because a part of a signal band is cut by the high-pass filters and these results in degraded signals, the cut-off frequency of the high-pass filters is required to be as small as possible.

If the amplification section of a receiver is configured to include multiple stages of gain control amplifiers 104, there is a possibility that the DC offset is over-amplified and saturated. Thus, capacitance elements are often employed between each stage of gain control amplifier. For example, this configuration is described in Harald Pretl et al., "Circuit and System Considerations for UMTS Zero-IF Receivers in SiGe BiCMOS," MWE2001 Microwave Workshop Digest WS11-4, pp. 264-268.

In another example, DC offset cancellation means are separately attached to all gain control amplifiers in an analog baseband signal processing block. This circuitry is shown in FIG. 5. For example, a direct conversion receiver using such circuitry has been disclosed in Japanese Published Unexamined Patent Application No. 2001-211098. In this direct conversion receiver, each amplification stage in the analog baseband block is configured such that an analog to digital converter (ADC) is connected to the output of each gain control amplifier, a DC offset voltage generated is detected by a control element CTL, and a digital to analog converter (DAC) applies a voltage to cancel the detected DC offset voltage to the gain control amplifier 104. In this arrangement, to use the direct conversion receiver in a Time Division Multiple Access (TDMA) system and a Time Division Duplex (TDD) system, the DC offset cancellation operation must be performed within an intermittent time period.

SUMMARY OF THE INVENTION

In the case of prior art for canceling the DC offset by employing capacitance elements, each capacitance element 401 must have a greater capacitance to make the cut-off frequency as low as possible and, consequently, it becomes impossible to install a sufficient number of capacitance elements on an integrated chip.

In the case of employing capacitance elements between each of multiple gain control amplifiers, it is required to use many capacitance elements located off-chip and increase in the number of external parts as well as increase in the number of pins on an integrated chip result in a problem.

In the case of prior art for canceling the DC offset, using the circuitry shown in FIG. 5, a certain time period (a few microseconds) is required to cancel the DC offset. Accordingly, the direct conversion receiver using this DC offset cancellation method is hard to use in a Code Division Multiple Access (CDMA) system or the like in which a receiver starts to receive and continues receiving. Moreover, as time elapses after canceling the DC offset, the DC offset may vary with ambient environmental change.

It is therefore an object of the present invention to provide a direct conversion receiver featuring DC offset cancellation which can be achieved with a reduced number of capacitance elements located off-chip and which can be applied even in a continuous receiving system with no intermittent time during a receiving operation.

A typical constitution of a direct conversion receiver of the present invention is briefly described below. The direct conversion receiver comprises a pair of mixers which convert a receive signal frequency to a baseband frequency and a baseband frequency signal processing block including a pair of first amplifiers and a pair of first filters, following the mixers, with a feature that the baseband frequency signal processing block further includes a pair of negative feedback circuits with an adjustable feedback factor, each negative feedback circuit including a low-pass filter. Through this arrangement, the DC offset can be cancelled and capacitance elements located off-chip can be reduced to those to be used only in the low-pass filters in the negative feedback circuits, whereas many off-chip capacitance elements have been required to be inserted between each stage of gain control amplifiers shown in a prior art example of FIG. 4. In addition, this direct conversion receiver can operate well in a continuous receiving system.

Instead of the above low-pass filter, a low-pass filter with an adjustable cut-off frequency may be used.

Each of the pair of first amplifiers may be configured in multistage composition and, in this case, each of the negative feedback circuits is preferably configured to loop back to an output of a first-stage amplifier.

The direct conversion receiver may further comprise a pair of DC offset cancellation circuits, each comprising an analog to digital converter (ADC) which is connected to an output of one of the pair of first amplifiers to convert analog signals to digital signals; a digital processing circuit which detects a DC offset voltage out of output signals from the ADC and calculates a voltage to cancel the DC offset voltage; and a digital to analog converter (DAC) which converts a digital signal of the voltage calculated by the digital processing circuit into an analog signal of the voltage and supplies the analog signal of the voltage to the one of the pair of first amplifiers.

In this case, it is preferable that DC offset cancellation is performed by means of the pair of DC offset cancellation circuits when the receiver is powered on and, subsequently, DC offset cancellation is performed by the pair of negative feedback circuits.

The above advantages and other advantages, objects, and features of the present invention will be more apparent from the following detailed description in reference to the accompanying drawings and the attached claims. In the accompanying drawings, the same reference numerals are used to identify the same or similar parts.

DETAILED DESCRIPTION OF THE PREFERRED EMBODIMENTS

Embodiment 1

Figure 1:
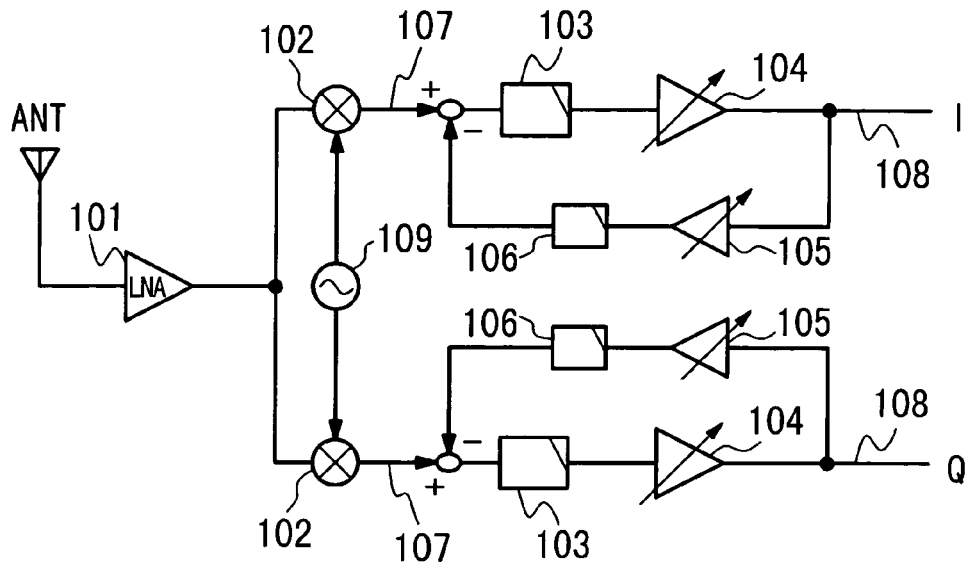
FIG. 1 is a circuit schematic of a baseband block of a direct conversion receiver according to a preferred Embodiment 1 of the present invention.

FIG. 1 is a diagram showing a preferred Embodiment 1 of the present invention. This schematic shows the circuitry of a baseband frequency signal processing block of a direct conversion receiver of the invention including its antenna ANT input, wherein the baseband block is arranged to include circuits for canceling the DC offset occurring in the baseband frequency analog signal processing block.

In FIG. 1, a low noise amplifier (LNA) 101 amplifies received signals. The frequency of the signal amplified by the LNA is the same as the receive signal frequency. Signals output from the low noise amplifier 101 are input to a pair of mixers 102 which perform quadrature demodulation of received signals. From a local oscillator 109, sinusoidal wave signals with a 90 degree phase difference are respectively input to the mixers 102. By using these sinusoidal wave signals, the mixers 102 perform quadrature demodulation of received signals and generate I and Q signals, respectively. In addition, the mixers 201 convert the frequencies of the I and Q signals from the receive signal frequency to a baseband frequency.

Following the mixers 102, the signals are processed at the baseband frequency. The signals then pass through low-pass filters 103 to suppress out-of-band noise of the signals, which can relax saturation of amplifiers in the following stage. The gain of gain control amplifiers 104 to amplify the signals to a required level varies, depending on the power level of the receive signal. In the baseband frequency processing block (following the outputs of the mixers 102) of the direct conversion receiver, each of the I and Q lines is arranged to include a negative feedback circuit which consists of an amplifier 105 and a low-pass filter 106, and thereby the DC offset can be canceled. When the negative feedback circuits each consisting of the amplifier 105 and the low-pass filter 106 are added to the direct conversion receiver, given that voltage at the mixer outputs 107 is an input voltage and voltage at the signal output points 108 of the gain control amplifiers 104 is output voltage, transfer functions of the elements are expressed in the following equation (1):

$$\frac{V_{out}}{V_{in}} = \frac{G \cdot Ha(s)}{1 + Ha(s) \cdot Hb(s) \cdot G \cdot B} \quad (1)$$

where, Ha(s) is a transfer function of the filters 103, Hb(s) is a transfer function of the low-pass filters 106, i.e., the filters of the negative feedback circuits, G is a gain of the gain control amplifiers 104, and B is a gain of the amplifiers 105 of the negative feedback circuits.

When the value of the gain G of the gain control amplifiers 104 changes, the transfer function Ha(s) changes and frequency characteristics also change accordingly. To solve this problem, the gain of the amplifiers 105 in the negative feedback circuits should be programmable and adjusted so that the product G·B of the gain G of the gain control amplifiers 104 and the gain B of the amplifiers 105 in the negative feedback circuits will be constant.

In the negative feedback circuit configuration, locating the low-pass filter 106 at the output of the gain control amplifier 105 is believed to be effective in terms of convergence time of the negative feedback circuit. This is because, as the gain of the gain control amplifier 105 is varied, discharge can be prevented by being charged by a capacitance element used in the low-pass filter 106 and, consequently, the convergence time to be required to cancel the DC offset can be shorten.

Figure 4:
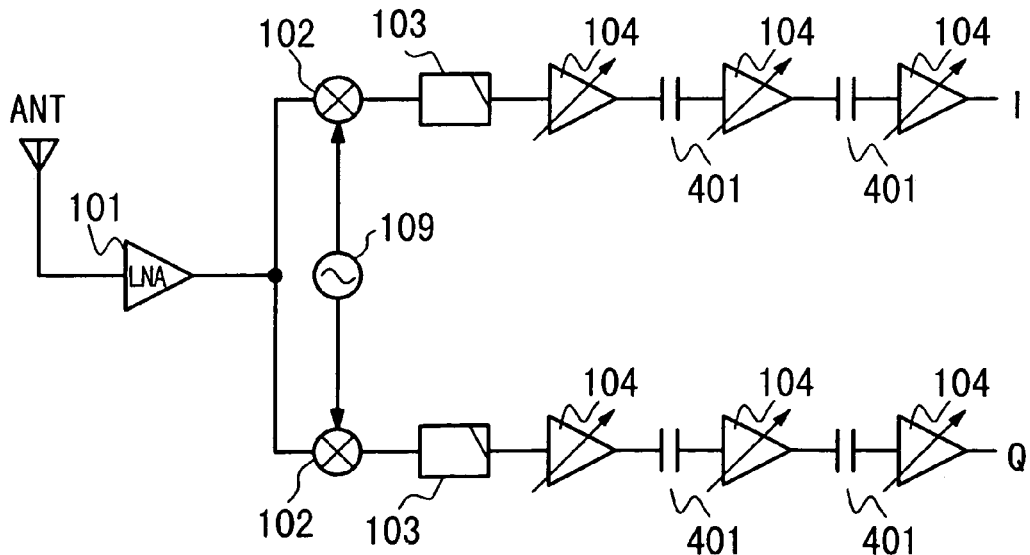
FIG. 4 is a diagram of baseband circuitry configured in accordance with a prior-art DC offset cancellation method.

Many capacitance elements located off-chip are required to form the prior-art baseband chain configuration using connection by the capacitance, shown in FIG. 4, whereas, in Embodiment 1, the number of such capacitance elements can be reduced to those to be used only in the low-pass filters 106 in the negative feedback circuits.

Figure 5:
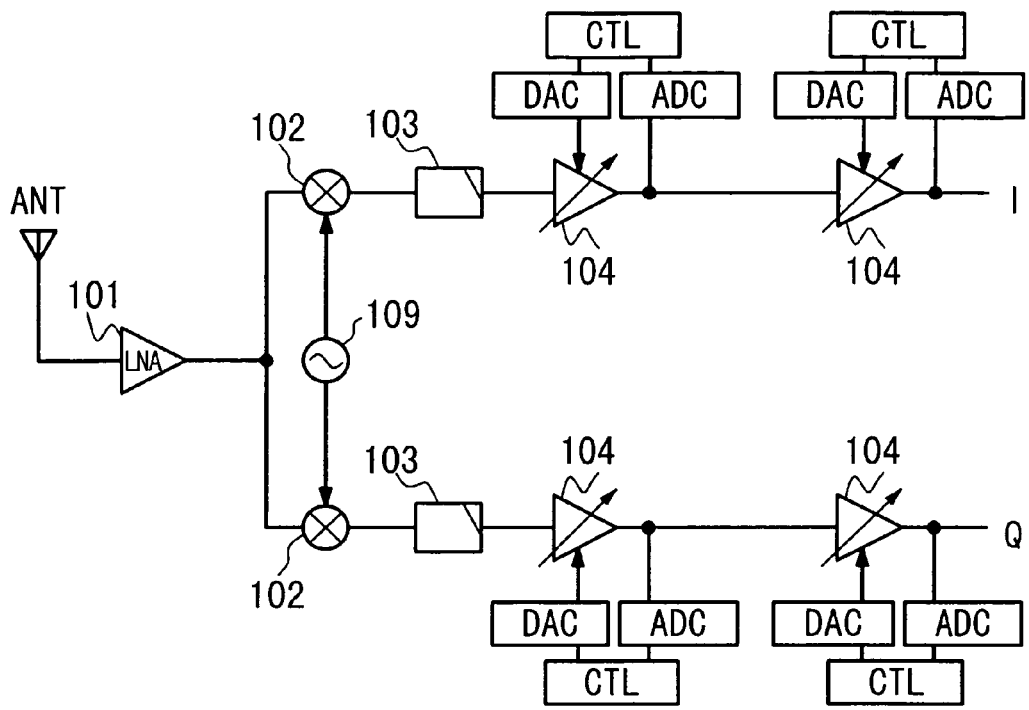
FIG. 5 is a diagram of baseband circuitry configured in accordance with another prior-art DC offset cancellation method.

Then, comparison is made between the DC offset occurring in the baseband signal processing block of Embodiment 1 shown in FIG. 1 and the DC offset occurring in the corresponding block of a prior art example shown in FIG. 5.

Figure 6:
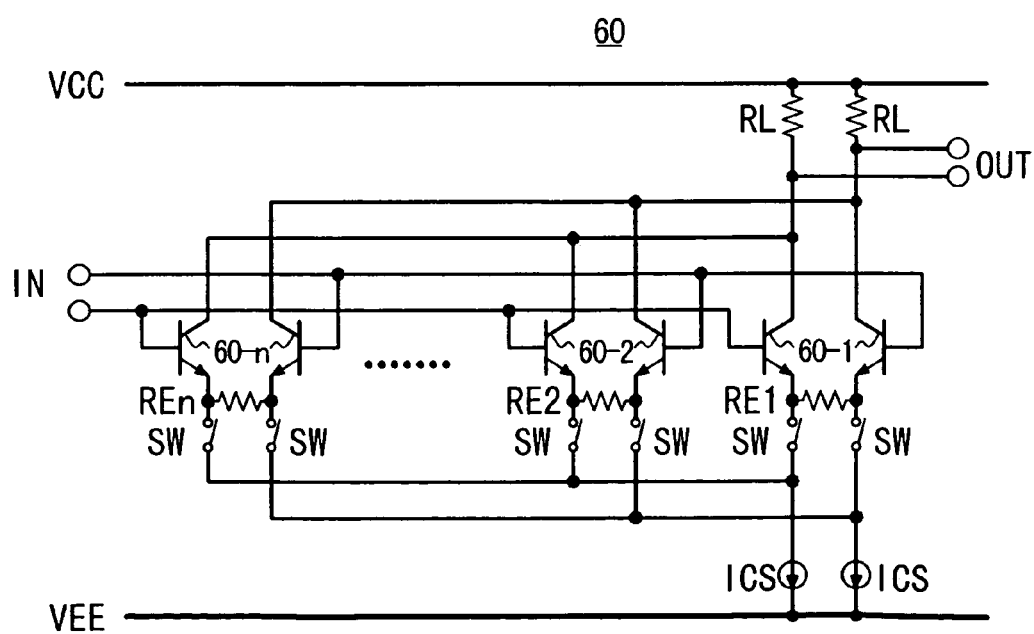
FIG. 6 is a circuit schematic of an example of a gain control amplifier to be applied in the direct conversion receiver of the present invention.

First, a first circuit configuration example of the gain control amplifiers 104 and 105 is shown in FIG. 6. A gain control amplifier circuit 60 shown in FIG. 6 includes couples of differential 60-1, 60-2, . . . 60-n installed between a high-potential power supply VCC and a low-potential power supply VEE. The emitters of the couples of differential are connected via switches SW and current sources ICS to the power supply VEE. Input differential signals IN are routed and go out of the circuit as output differential signals OUT from both load resistance elements RL which are connected between the power supply VCC and the collectors of the couples of differential.

The emitters of one couple of differential 6-1 are connected across a resistor R1, the emitters of another couple of differential 6-2 are connected across a resistor R2 having a different resistance value from the R1, the emitters of still another couple differential 60-n are connected across a resistor Rn having a different resistance value from the other resistors, and so on. In this gain control amplifier circuit configuration, the switches SW turn on/off the connections between the current sources ICS and each couple of differential, and thereby the gain of the gain control amplifier changes in steps accordingly.

Figure 7:
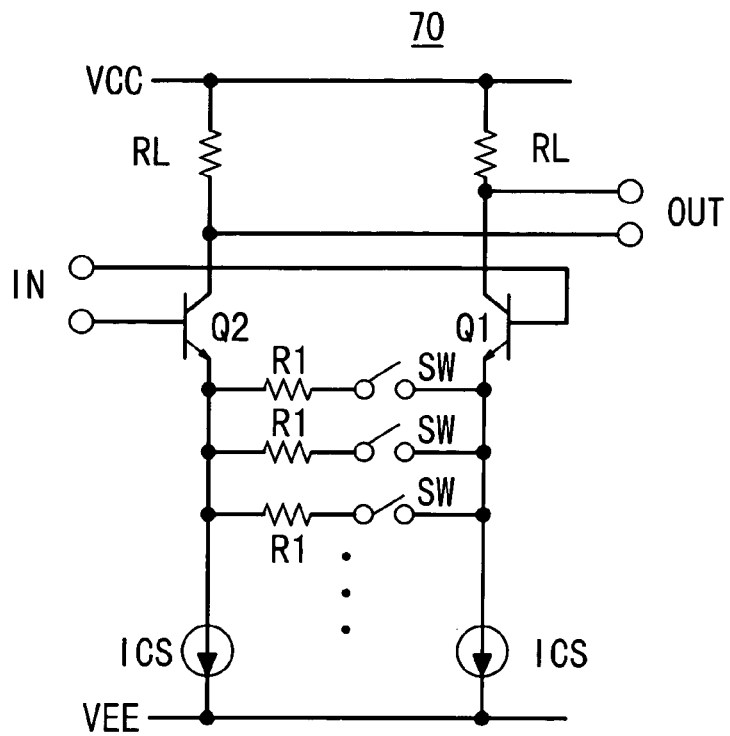
FIG. 7 is a circuit schematic of another example of a gain control amplifier to be applied in the direct conversion receiver of the present invention.

Next, a second circuit configuration example of the gain control amplifiers 104 and 105 is shown in FIG. 7. Unlike the gain control amplifier circuit 60 shown in FIG. 6, this circuit is configured to include one couple of differential consisting of transistors Q1 and Q2 of same characteristics. The emitters of the transistors are connected across multiple parallel paths in each of which an emitter resistor R1 and a switch SW are serially connected. As the switch SW connects or disconnects the emitter resistor R1 in each parallel path, the gain of this gain control amplifier circuit 70 changes in steps.

Figure 11:
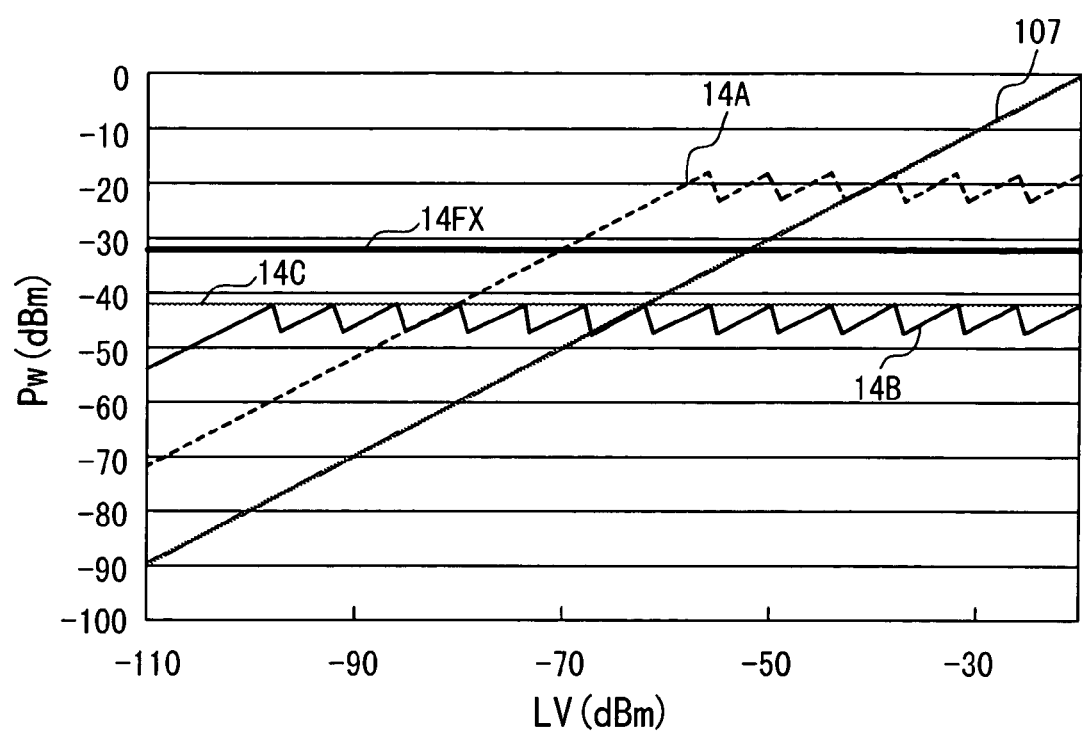
FIG. 11 is a level diagram for simulation assumed for individual amplifiers shown in FIG. 12.

On the assumption that the gains of the gain control amplifiers configured as shown in FIG. 6 or FIG. 7 are controlled, according to a level diagram which is shown in FIG. 11, the resultant DC offset is compared with the DC offset involved in the corresponding baseband block of the prior art example. FIG. 11 shows a power level diagram, supposing that an amplifier 104 in the baseband signal processing block was realized in multiple stages comprising three gain control amplifiers 104A, 104B, 104C, and one static gain amplifier 104FX, as in shown in FIG. 12. Note that FIG. 12 shows the amplifiers in only the I signal branch, but the same amplifiers exist in the Q signal branch as well, which are not shown for explanatory purposes.

As regards the level diagram, a maximum value was set for the output power of each amplifier so that saturation does not occur between each stage of amplification. In the diagram of FIG. 11, the output power level Pw (dBm) of each amplifier is plotted on the ordinate and receive power level LV (dBm) is plotted on the abscissa.

In FIG. 11, a slant solid line 107 denotes mixer output, a slant dotted line 14A denotes the output of the first-stage gain control amplifiers 104A, a horizontal zigzag line 14B denotes the output of the second-stage gain control amplifiers 104B, a horizontal line 14C denotes the output of the third-stage gain control amplifiers 104C, and a horizontal bold line 14FX denotes the output of the last-stage static gain amplifier 104FX, wherein these lines correspond to the power level transitions of each amplifier with receive power change.

Figure 8:
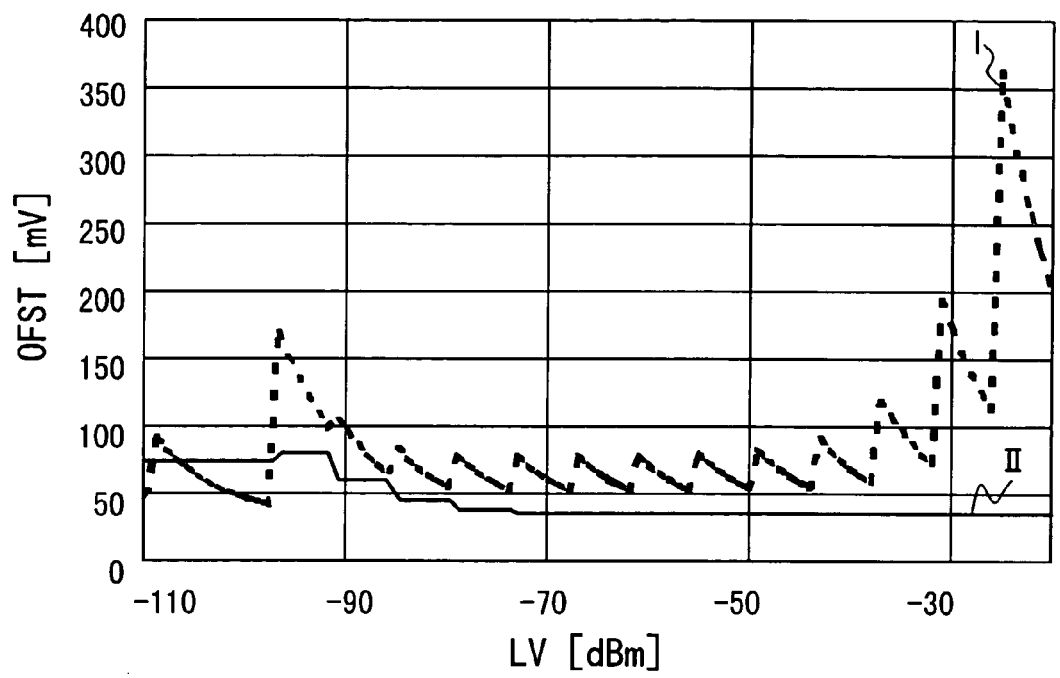
FIG. 8 is a graph showing the result of DC offset characteristic simulation in the prior-art baseband block configured as shown in FIG. 5.
Figure 9:
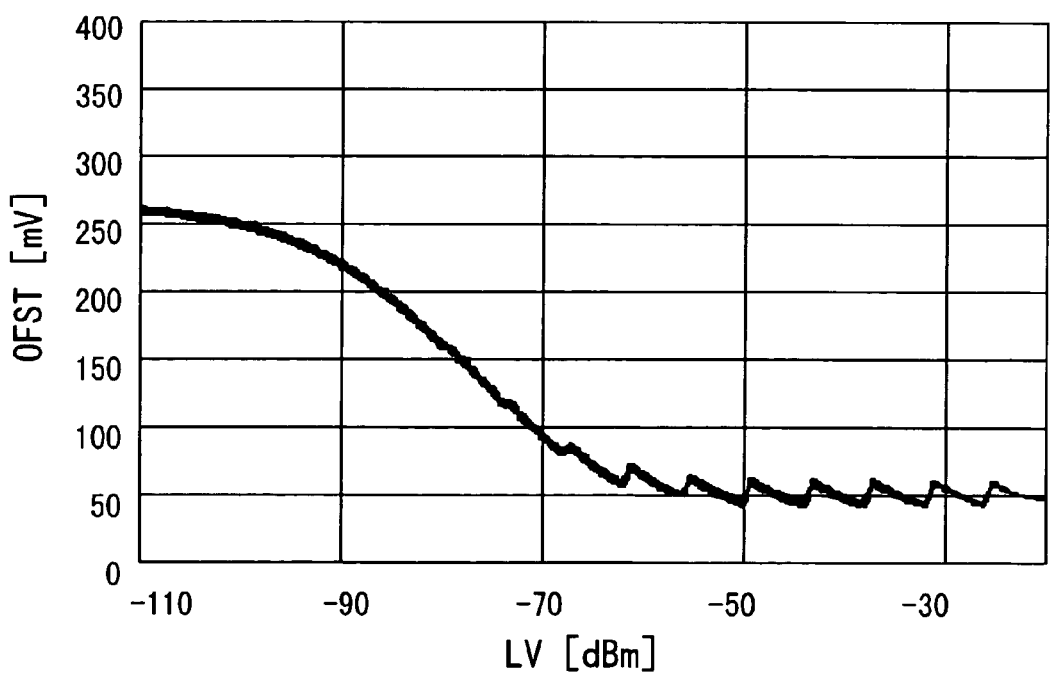
FIG. 9 is a graph showing the result of DC offset characteristic simulation in the baseband circuitry of Embodiment 1 shown in FIG. 1.
Figure 12:
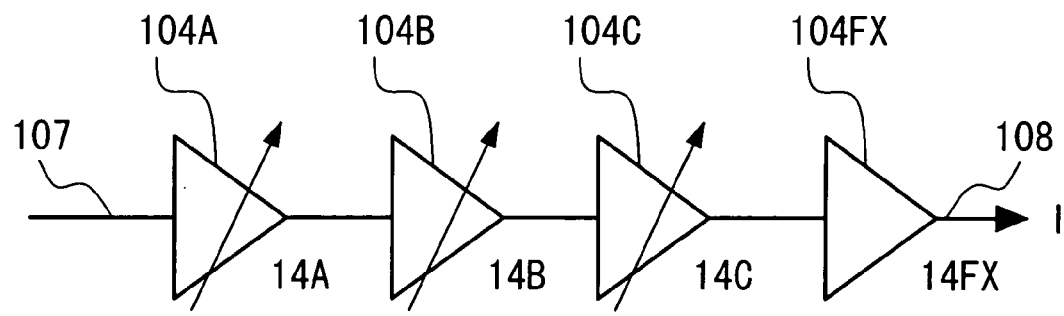
FIG. 12 is a block circuit diagram showing an example of multistage realization of a gain control amplifier in the baseband signal processing block, wherein the multistage realization comprises three gain control amplifiers and one static gain amplifier.

Change in the DC offset occurring at the output signal point 108 shown in FIG. 12 was simulated, assuming amplification according to the level diagram in FIG. 12, using the gain control amplifiers 104A to 104C configured as shown in FIG. 6 or FIG. 7. Results of this simulation for the prior art example and the present embodiment are shown in FIGS. 8 and 9, respectively. In graphs shown in these figures, the DC offset voltage OFST (mV) generated at the output signal point 108 is plotted on the ordinate and receive power level LV (dBm) is plotted on the abscissa.

FIG. 8 is a graph of the DC offset OFST generated vs. receive power when the DC offset calibration means were applied in the baseband block configured as shown in FIG. 5, which is the prior art example. In FIG. 8, a characteristic line I denotes the DC offset characteristic when the gain control amplifiers were configured, according to the arrangement of the gain control amplifier circuit 60 shown in FIG. 6 and a characteristic line II denotes the DC offset characteristic when the gain control amplifiers were configured, according to the arrangement of the gain control amplifier circuit 70 shown in FIG. 7. It is assumed that calibration was performed only once at the start of receiving with the gain control amplifiers 104A to 104C being set at their maximum gains.

FIG. 9 is a graph of the DC offset OFST generated vs. receive power when the DC offset cancellation means were applied in the baseband block including the negative feedback circuits, each consisting of the gain control amplifier 105 and the low-pass filter 106, as set forth in Embodiment 1. In this case, the same results were obtained when the gain control amplifiers were configured, according to the arrangement of the gain control amplifier circuit 60 shown in FIG. 6 and when the gain control amplifiers were configured, according to the arrangement of the gain control amplifier circuit 70 shown in FIG. 7. A fixed feedback factor of 0.5 was used assuming that the output of the last-stage static gain amplifier 104FX was fed back to the output of the first-stage gain control amplifier 104A.

By the gain feedback via the filter 103 to the output of the first-stage gain control amplifier, noise figure degradation can be suppressed. Because the aggregate gain of the second-stage and third-stage gain control amplifiers 104B, 104C, and the last-stage static gain amplifier 104FX is supplied via the filter 103 to the output of the first-stage gain control amplifier 104A, a strong effect of DC offset cancellation can be sustained. Although the fixed feedback factor of 0.5 was used here, the feedback factor may be adjustable to prevent partial loss of receive signal bandwidth while canceling the offset. At a receive level permitting a high feedback factor setting, a stronger effect of DC offset cancellation is attainable.

The simulation result of the prior art example shown in FIG. 8 and the simulation result of Embodiment 1 shown in FIG. 9 are compared. When the receiver receives a signal at a higher receive power level LV, the effect of interference waves and noise generated in an adjacent frequency channel on the signal appears to be relatively small. Thus, the DC offset is considered to be easily permissible at higher receive power level LV. In view hereof, the simulation result of Embodiment 1 shown in FIG. 9 is better than that of the prior art shown in FIG. 8. Furthermore, by configuring the gain control amplifiers 104A to 104C, according to the arrangement of the gain control amplifier circuit 70 shown in FIG. 7, a stronger effect of DC offset cancellation is attainable.

Embodiment 2

Figure 2:
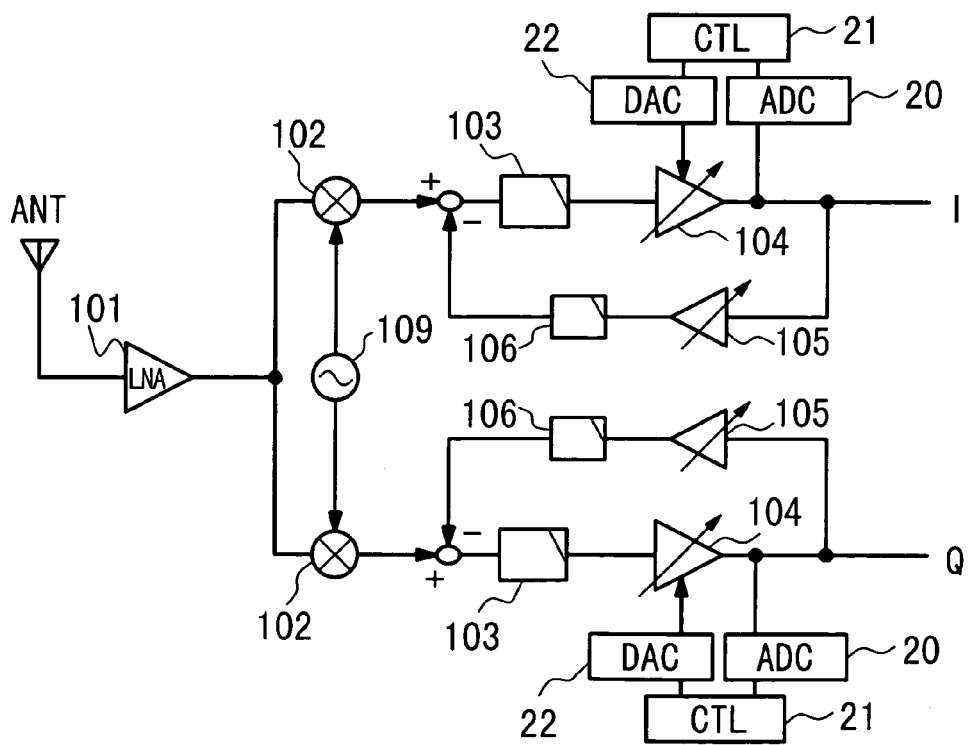
FIG. 2 is a circuit schematic of a baseband block of a direct conversion receiver according to a preferred Embodiment 2 of the present invention.

FIG. 2 is a diagram showing a preferred Embodiment 2 of the present invention and this schematic shows the circuitry of the baseband frequency signal processing block of a direct conversion receiver of the invention including its antenna ANT input. In Embodiment 2, pairs of analog to digital converters ADC 20, control circuits CTL 21, and digital to analog converters DAC 22 are added to the above-discussed baseband block configuration of Embodiment 1 shown in FIG. 1.

To the output of a gain control amplifier 104, an ADC 20 which converts analog signals to digital signals is connected. The digital signal after the conversion undergoes digital operation processing in a control circuit CTL 21 and a DC offset component is detected. Voltage to cancel this DC offset component is applied through a DAC 22 which performs digital to analog conversion to the gain control amplifier 104 However, the DC offset cancellation by using the arrangement of the analog to digital converter ADC 20, control circuit CTL 21, and digital to analog converter DAC 22 has a drawback of generating a large noise during cancellation and other problems. Thus, the direct conversion receiver using this DC offset cancellation method is hard to use in a continuous receiving system such as CDMA in which, after a receiver starts to receive, there is no intermittent time during reception.

If the direct conversion receiver of Embodiment 2 is used in the continuous receiving system; the DC offset cancellation using the above arrangements of the ADC 20, CTL 21, and DAC 22 should be performed only once immediately after the receiver starts to receive and, subsequently, the DC offset should be canceled by the circuit arrangements using the negative feedback discussed in the foregoing Embodiment 1. As time elapses, DC offset drift may occur, that is, the DC offset value may vary, affected by temperature change and other ambient conditions. However, this drift problem can be avoided by attaching the negative feedback circuits to the baseband block. If the direct conversion receiver of Embodiment 2 is used in TDMA and TDD systems, the DC offset cancellation using the arrangements of the ADC 20, CTL 21, and DAC 22 may be performed, taking advantage of intermittent time intervals when the receiver does not receive a signal.

Figure 10:
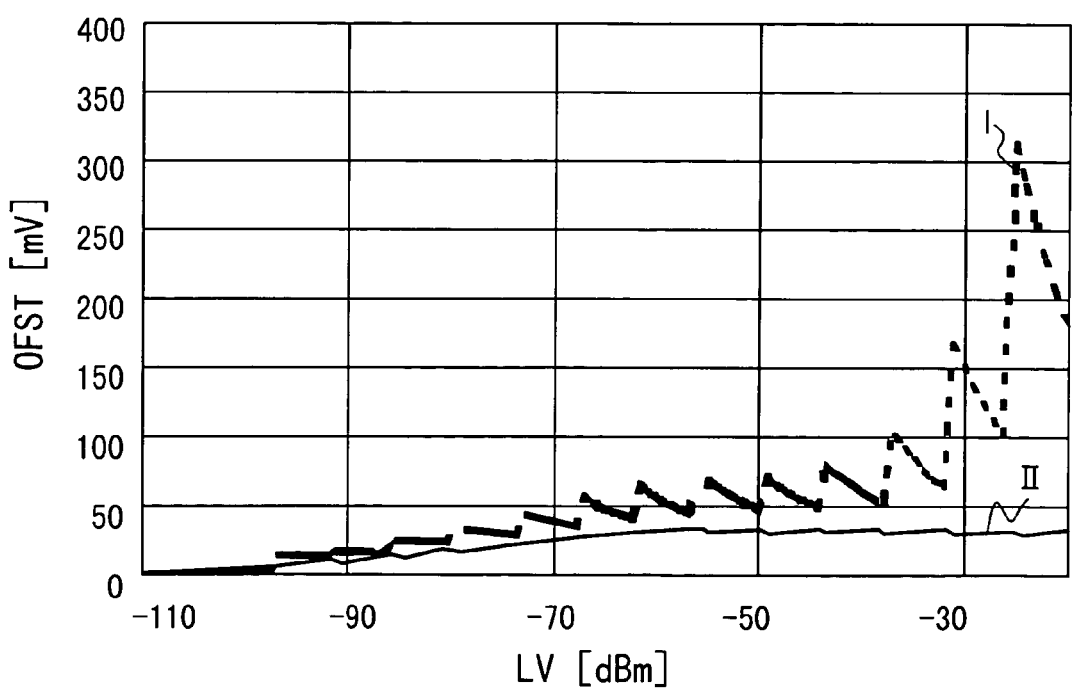
FIG. 10 is a graph showing the result of DC offset characteristic simulation in the baseband circuitry of Embodiment 2 shown in FIG. 2.

Then, comparison is made between the DC offset occurring in Embodiment 2 shown in FIG. 2 and the DC offset occurring in the prior art example shown in FIG. 5. FIG. 10 is a graph of DC offset transition vs. receive power, obtained from the simulation of the DC offset generated in the baseband block with the DC offset cancellation arrangements shown in FIG. 2 of Embodiment 2. As stated in the foregoing Embodiment 1, this simulation assumes that a gain control amplifier 104 is realized in the multistage chain composition shown in FIG. 12 and that the gain is amplified, according to the level diagram in FIG. 11. A characteristic line I denotes the DC offset characteristic when the gain control amplifiers were configured, according to the arrangement of the gain control amplifier circuit 60 shown in FIG. 6 and a characteristic line II denotes the DC offset characteristic when the gain control amplifiers were configured, according to the arrangement of the gain control amplifier circuit 70 shown in FIG. 7. It was assumed that calibration was performed only once at the start of receiving with the gain control amplifiers being set at their maximum gains (with the minimum receive level) After the start of receiving, the DC offset is cancelled by the negative feedback. A fixed feedback factor of 0.5 was used, assuming that the output of the last-stage static gain amplifier 104FX was fed back via the filter 103 to the output of the first-stage gain control amplifier 104A. Although the fixed feedback factor of 0.5 was used, the feedback factor may be adjustable so that DC offset cancellation can be performed more effectively. In this case, it is preferable that the amplifier 105 or the filter 106 in each negative feedback circuit is made adjustable in response to the gain control amplifier 104 chain.

The simulation result of Embodiment 2 shown in FIG. 10 shows that more effective DC offset cancellation is performed over the whole range of receive level as compared with the result of the prior art example shown in FIG. 8. Moreover, by configuring the gain control amplifiers 104A to 104C, according to the arrangement of the gain control amplifier circuit 70 shown in FIG. 7, still more effective DC offset cancellation can be performed.

Embodiment 3

Figure 3:
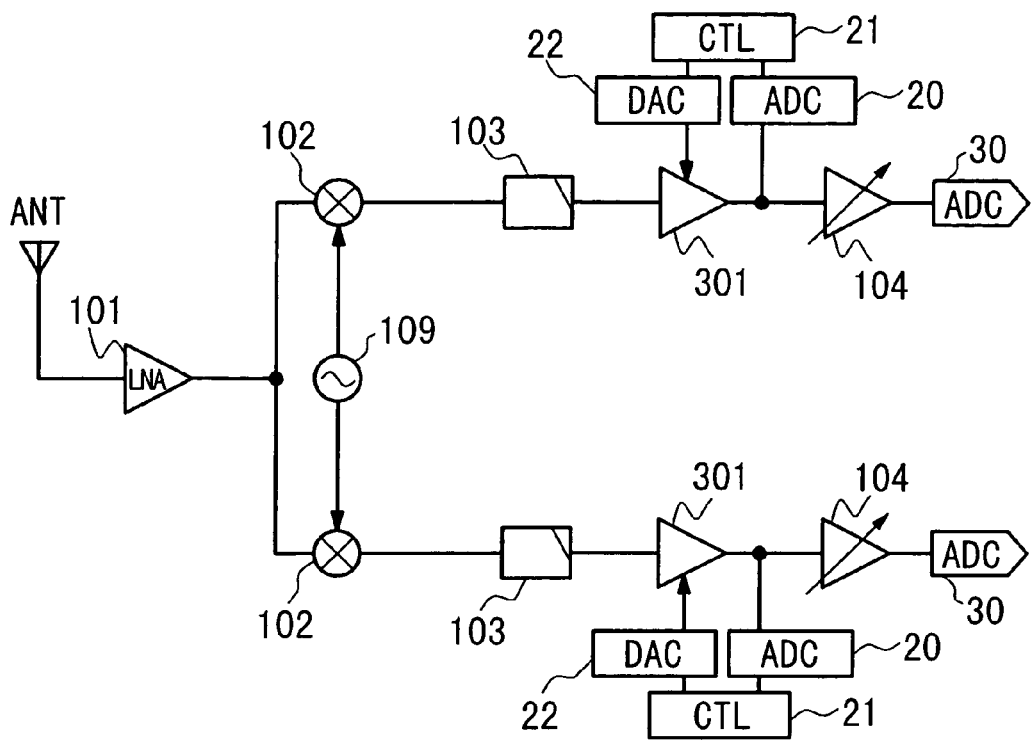
FIG. 3 is a circuit schematic of a baseband block of a direct conversion receiver according to a preferred Embodiment 3 of the present invention.

FIG. 3 is a diagram showing a preferred Embodiment 3 of the present invention and this schematic shows the circuitry of the baseband frequency signal processing block of a direct conversion receiver of the invention including its antenna ANT input. In Embodiment 3, a pair of static gain amplifiers 301 are located in front of the gain control amplifiers 104, respectively, and DC offset cancellation is performed for these static gain amplifiers 301 by means of the arrangements of ADC, CTL, and DAC. Because, the mixers 102, filters 103, and static gain amplifiers 301 in the analog baseband signal processing block for which the DC offset becomes a problem all have static gains, once calibration to cancel the DC offset has been performed, there is no need for additional calibration regardless of receive level change.

Carrier signals are usually converted into digital signals by ADCs 30 located after the output ends of the gain control amplifiers 104. If the ADCs 30 are of a type of a great number of bits, the gain of the gain control amplifiers 104 can be diminished. Here, assume that the DC offset at the outputs of the amplifiers 301 could be suppressed to 10 mV below and that a maximum gain of 15 dB of the gain control amplifiers 104 is sufficient for the bits capability of the ADCs 30. At this time, if DC offset cancellation is performed by means of the arrangements shown in FIG. 3, the DC offset at the outputs of the gain control amplifiers 104 can be suppressed to at most 56 mV. The gain control amplifiers 104 in Embodiment 3 may be configured, according to the arrangement of the gain control amplifier circuit 60 shown in FIG. 6 or the arrangement of the gain control amplifier circuit 70 shown in FIG. 7.

While the present invention has been described hereinbefore through setting forth its some preferred embodiments, it will be appreciated that the present invention is not limited to the foregoing embodiments and may be embodied in other modified forms of design without departing from its spirit. For example, as regards Embodiment 1, while each negative feedback circuit consists of a gain control amplifier and a low-pass filter and with an adjustable feedback factor, the each negative feedback circuit may consist of a low-pass filter with an adjustable cut-off frequency and a static gain amplifier.

As is obvious from the foregoing embodiments, according to the present invention, the DC offset occurring in a signal band, which is generated in a direct conversion receiver, can be cancelled.

The direct conversion receiver of the present invention can be applied even in a continuous receiving system and is capable of canceling the DC offset effectively.

What is claimed is:

1. A direct conversion receiver, comprising:
   a pair of mixers which convert a receive signal frequency to a baseband frequency;
   a baseband frequency signal processing block including a pair of first gain control amplifiers and a pair of first filters, following said mixers; and
   a pair of DC offset cancellation circuits, each comprising:
   an analog to digital converter which is connected to an output of one of said pair of first gain control amplifiers to convert analog signals to digital signals;
   a digital processing circuit which detects a DC offset voltage out of output signals from said analog to digital converter and calculates a voltage to cancel the DC offset voltage; and
   a digital to analog converter which converts a digital signal of the voltage calculated by the digital processing circuit into an analog signal of the voltage and supplies the analog signal of the voltage to said one of said pair of first gain control amplifiers,
   wherein said baseband frequency signal processing block further includes a pair of negative feedback circuits with an adjustable feedback factor, each negative feedback circuit including a second filter of low-pass type,
   wherein said direct conversion receiver performs DC offset cancellation by means of said pair of DC offset cancellation circuits when being powered on and, subsequently, performs DC offset cancellation by means of said pair of negative feedback circuits.

2. The direct conversion receiver according to claim 1, wherein each said negative feedback circuit comprises a second amplifier and said second filter located, following an output end of the second amplifier.

3. The direct conversion receiver according to claim 2, wherein said second amplifier is a gain control amplifier.

4. The direct conversion receiver according to claim 1, wherein said second filter is a low-pass filter with an adjustable cut-off frequency.

5. A direct conversion receiver comprising:

a pair of mixers which convert a receive signal frequency to a baseband frequency; and a baseband frequency signal processing block including a pair of first gain control amplifiers and a pair of first filters, following said mixers, wherein said baseband frequency signal processing block further includes a pair of negative feedback circuits with an adjustable feedback factor, each negative feedback circuit including a second filter of low-pass type, wherein said pair of first gain control amplifiers have multistage compositions in which a pair of first-stage amplifiers are a pair of static gain amplifiers to which a pair of DC offset cancellation circuits are attached respectively, each said DC offset cancellation circuit comprising:

an analog to digital converter which is connected to an output of one of said pair of first gain control amplifiers to convert analog signals to digital signals;

a digital processing circuit which detects a DC offset voltage out of output signals from said analog to digital converter and calculates a voltage to cancel the DC offset voltage; and a digital to analog converter which converts a digital signal of the voltage calculated by the digital processing circuit into an analog signal of the voltage and supplies the analog signal of the voltage to said one of said pair of first gain control amplifiers, wherein said pair of static gain amplifiers perform DC offset cancellation by means of said pair of DC offset cancellation circuits when said direct conversion receiver is powered on and, subsequently, DC offset cancellation is performed by means of said pair of negative feedback circuits.

6. A direct conversion receiver comprising:

a pair of mixers which convert a receive signal frequency to a baseband frequency; and a baseband frequency signal processing block including a pair of first gain control amplifiers and a pair of first filters, following said mixers, wherein said baseband frequency signal processing block further includes a pair of negative feedback circuits with an adjustable feedback factor, each negative feedback circuit including a second filter of low-pass type, wherein each of said pair of first gain control amplifiers is made up of multiple stages of gain control amplifiers and a last-stage static gain amplifier and each said negative feedback circuit loops back to an output of a first-stage gain control amplifier.

7. The direct conversion receiver according to claim 6, wherein each said negative feedback circuit comprises a second amplifier and said second filter located, following an output end of the second amplifier.

8. The direct conversion receiver according to claim 7, wherein said second amplifier is a gain control amplifier.

9. A direct conversion receiver comprising:

a pair of mixers which convert a receive signal frequency to a baseband frequency; and a baseband frequency signal processing block including a pair of first gain control amplifiers and a pair of first filters, following said mixers, wherein said baseband frequency signal processing block further includes a pair of negative feedback circuits with an adjustable feedback factor, each negative feedback circuit including a second filter of low-pass type, wherein said pair of first gain control amplifiers are pair of gain control amplifiers having circuitry in which a plurality of different resistance elements are located so as to connect to a common terminal of the emitter side of a couple of differential transistors and gain is changed in steps by switching on/off current flowing through the plurality of resistance elements.

10. The direct conversion receiver according to claim 9, wherein each said negative feedback circuit comprises a second amplifier and said second filter located, following an output end of the second amplifier.

11. The direct conversion receiver according to claim 10, wherein said second amplifier is a gain control amplifier.

* * * * *